United States Patent
Yen

(10) Patent No.: US 6,557,707 B1
(45) Date of Patent: May 6, 2003

(54) ELECTRONIC COMPONENT PACKAGING STRIP

(75) Inventor: Yung-yu Yen, Tu-Cheng (TW)

(73) Assignee: Ultra -Pak Industries Co., Ltd., Taipei Hsien (TW)

( * ) Notice: Subject to any disclaimer, the term of this patent is extended or adjusted under 35 U.S.C. 154(b) by 47 days.

(21) Appl. No.: 09/985,582

(22) Filed: Nov. 5, 2001

(51) Int. Cl.[7] .............................................. B65D 85/00
(52) U.S. Cl. ...................................... 206/714; 206/725
(58) Field of Search ................................ 206/713–717, 206/719, 725, 722, 724, 820, 390, 509, 564, 562

(56) References Cited

U.S. PATENT DOCUMENTS

| | | | |
|---|---|---|---|
| 5,152,393 A | * 10/1992 | Chenoweth | 206/714 |
| 5,234,104 A | * 8/1993 | Schulte et al. | 206/714 |
| 5,361,901 A | * 11/1994 | Schenz et al. | 206/714 |
| 5,794,784 A | * 8/1998 | Murphy | 206/725 |
| 5,964,353 A | * 10/1999 | Hamlin | 206/714 |
| 5,988,394 A | * 11/1999 | Emoto et al. | 206/724 |
| 6,076,681 A | * 6/2000 | Chenoweth | 206/714 |
| 6,149,010 A | * 11/2000 | Tanaka et al. | 206/714 |
| 6,179,127 B1 | * 1/2001 | Kato et al. | 206/714 |
| 6,270,614 B1 | * 8/2001 | Naito et al. | 156/272.2 |
| 6,467,627 B1 | * 10/2002 | Troxtell, Jr. | 206/714 |

FOREIGN PATENT DOCUMENTS

| TW | 86211417 | 6/1999 |
|---|---|---|
| TW | 85217916 | 3/2000 |

* cited by examiner

*Primary Examiner*—Shian Luong
(74) *Attorney, Agent, or Firm*—Rabin & Berdo, P.C.

(57) ABSTRACT

A packaging strip has a series of receiving cavities formed thereon for each receiving an electronic component therein. Each of the receiving cavities is internally provided along peripheral edges with ribs and near a central area with a stepped land portion. The electronic component is received in the receiving cavity with its peripheral edges rested on the ribs, so that most part of the electronic component is suspended in the receiving cavity and a distance is kept between contacts at a bottom surface of the electronic component and a bottom of the receiving cavity. The stepped land portion restricts the electronic component from moving in the receiving cavity. When the packaging strip is wound into a roll and compresses the receiving cavities, the land portions arch to elevate the electronic components, protecting contacts of the electronic components from damage due to collision with the receiving cavity.

4 Claims, 7 Drawing Sheets

ELECTRONIC COMPONENT PACKAGING STRIP

FIELD OF THE INVENTION

The present invention relates to a packaging strip having a plurality of continuous receiving cavities for receiving electronic components therein. Each of the receiving cavities includes ribs provided along peripheral edges thereof and a stepped land portion provided near a central area thereof. The electronic component is received in the receiving cavity with its peripheral edges rested on the ribs and its central portion rested on the stepped land portion, so that most part of the electronic component is suspended in the receiving cavity and a distance is kept between contacts at a bottom surface of the electronic component and a bottom of the receiving cavity. When the receiving cavities are compressed while the packaging strip is wound into a roll, the land portions arch to elevate the electronic components and thereby protect contacts of the electronic components from damage due to collision with the receiving cavity under pressure.

BACKGROUND OF THE INVENTION

Taiwan Patent Application No. 86211417 discloses an electronic component carrying strip that is provided with frames having contours generally similar to that of the electronic components to be carried. The frames are slightly raised from a horizontal surface of the carrying strip when the latter is wound around a reel. Moreover, each of the frames is provided near a center thereof with a small spot of adhesive. The electronic component is adhered to the small spot of adhesive and restrained in place by the frame that generally meets the contour of the electronic component.

For an electronic component having contacts formed at a bottom surface thereof in the manner of ball grid array (BGA), the contacts are easily deformed due to any collision with other things. When the electronic components having BGA contacts are carried over the carrying strip disclosed in Taiwan Patent Application No. 86211417, the contacts tend to collide with the carrying strip and become damaged or unusable when the carrying strip is wound into a roll. In other words, the carrying strip for electronic components disclosed in Taiwan Patent Application No. 86211417 does not include any structure to protect the contacts on the electronic components and is therefore not suitable for positioning electronic components, particularly those with BGA contacts.

Another Taiwan Patent Application No. 85217916 discloses a packaging strip provided with boxes into which electronic components are packaged. Each of the boxes has inward beveled top edges to facilitate easy positioning of the electronic components into the boxes and to obtain an enhanced structural strength for the boxes. Again, the disclosure of Taiwan Patent Application No. 85217916 does not include any structure to protect the electronic component having BGA contacts.

It is therefore desirable to develop a packaging strip for electronic components to protect the contacts on the electronic components from damage due to collision with the packaging strip when the latter is being wound.

SUMMARY OF THE INVENTION

A primary object of the present invention is to provide an electronic components packaging strip capable of protecting electronic components packaged therein from damaged contacts even when the packaging strip is compressed, for example, while being wound into a roll.

Another object of the present invention is to provide an electronic component packaging strip that includes means to hold the electronic components to the packaging strip and restrict them from moving.

A further object of the present invention is to provide an electronic component packaging strip that includes structurally strengthened locating means for holding the electronic components to the packaging strip, and the locating means are not subject to permanent deformation even the packaging strip has been wound and stretched many times.

To achieve the above and other objects, the electronic component packaging strip of the present invention has a plurality of serially and continuously arranged receiving cavities formed thereon for each receiving an electronic component therein. Each of the receiving cavities is internally provided along peripheral edges with ribs and near a central area with a stepped land portion. The electronic component is received in each receiving cavity with its peripheral edges rested on the ribs and its bottom central area rested on the stepped land portion, so that most part of the electronic component is suspended in the receiving cavity and a distance is kept between BGA contacts provided at a bottom surface of the electronic component and a bottom of the receiving cavity. The stepped land portion provides an upward projected central area serving as a locating means to engage with the bottom central area of the electronic component and thereby restricts the electronic component from moving in the receiving cavity. When the packaging strip is wound into a roll, the land portion arches to elevate the electronic component and protects contacts on the bottom surface of the electronic element from damage due to collision with the bottom of the receiving cavity under pressure. The locating means is provided at a top with grooves arranged in predetermined patterns, so that the entire land portion has an enhanced structural strength.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
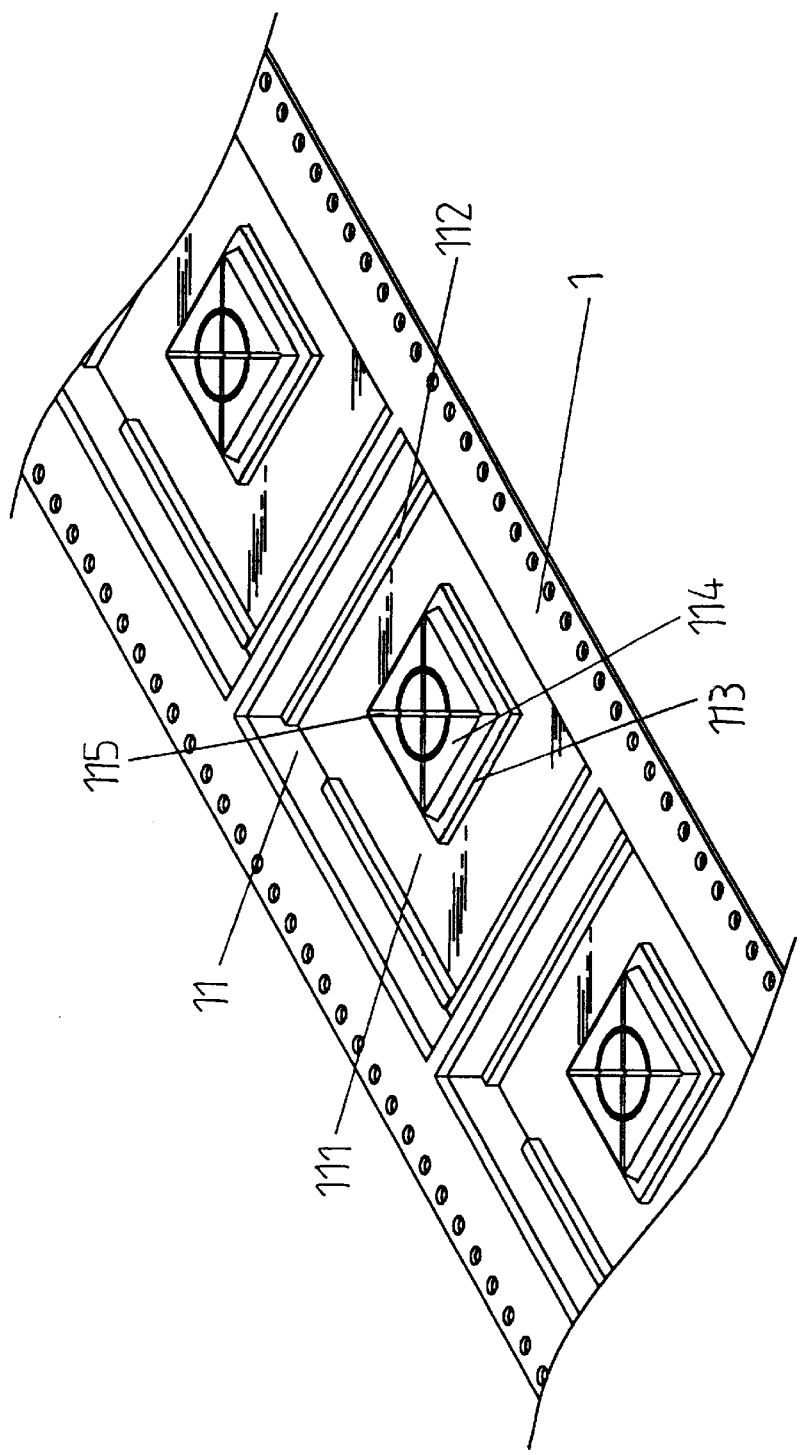
FIG. 1 is a fragmentary perspective view of an electronic component packaging strip according to the present invention.

Please refer to FIG. 1 that is a fragmentary perspective view of an electronic component packaging strip 1 according to the present invention. The packaging strip 1 is a long strip that could be wound into a roll and having a row of serially and continuously arranged receiving cavities 11 formed through press molding. Each of the receiving cavities 11 is internally provided along every peripheral edge with a rib 112, and near a central area with a square land portion 113 raised from a bottom 111 of the receiving cavity 11. In a preferred embodiment, the ribs 112 are arranged into a plurality of pairs of two opposite ribs. Each of the land portions 113 has a stepped top so that a central area thereof projects from the top of the land portion 113 to serve as a locating means 114 and a shoulder portion is formed around the location means 114. Moreover, the locating means 114 is provided at a top with a plurality of grooves 115 arranged in predetermined patterns to increase an overall structural strength of the land portion 113. In the illustrated embodiment, the grooves 115 include two intersected straight grooves and a circular groove.

Figure 2:
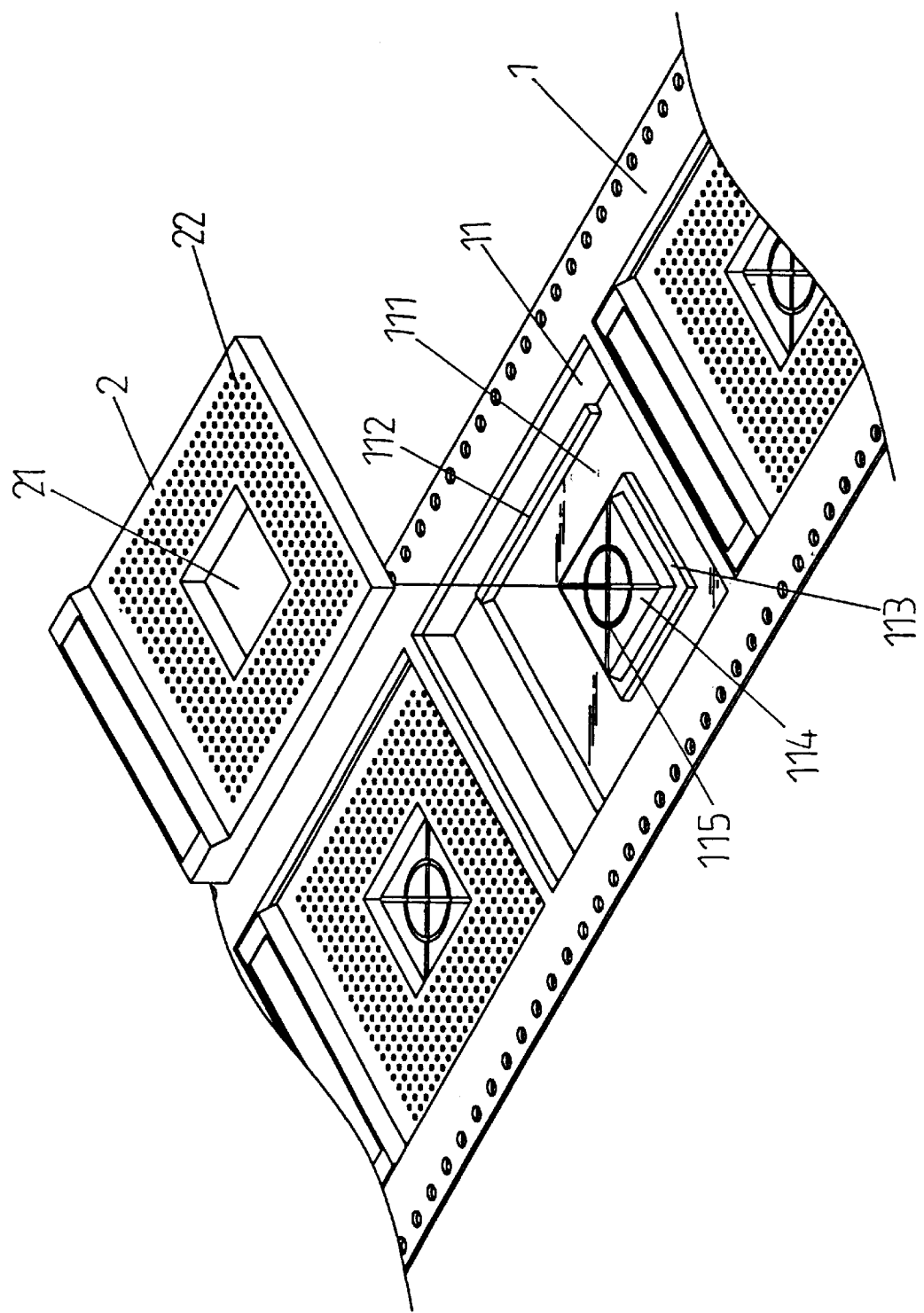
FIG. 2 shows the packaging strip of FIG. 1 is used to package connectors.

Please refer to FIG. 2. Each of the receiving cavities 11 is designed to receive an electronic component therein. In the illustrated embodiment of FIG. 2, the electronic component is a connector 2 having contacts 23 (see FIG. 3) formed at a bottom surface thereof in the manner of ball grid array (BGA). It is to be noted that the connector 2 is a standardized component onto which a central processing unit (CPU) is plugged. The connector 2 has a central square opening 21 and a plurality of pinholes 22 arranged around the opening 21 for each receiving a pin provided on the CPU. The pinholes 22 extend a full thickness of the connector 2, and the contacts 23 are correspondingly formed at lower ends of the pinholes 22.

Figure 3:
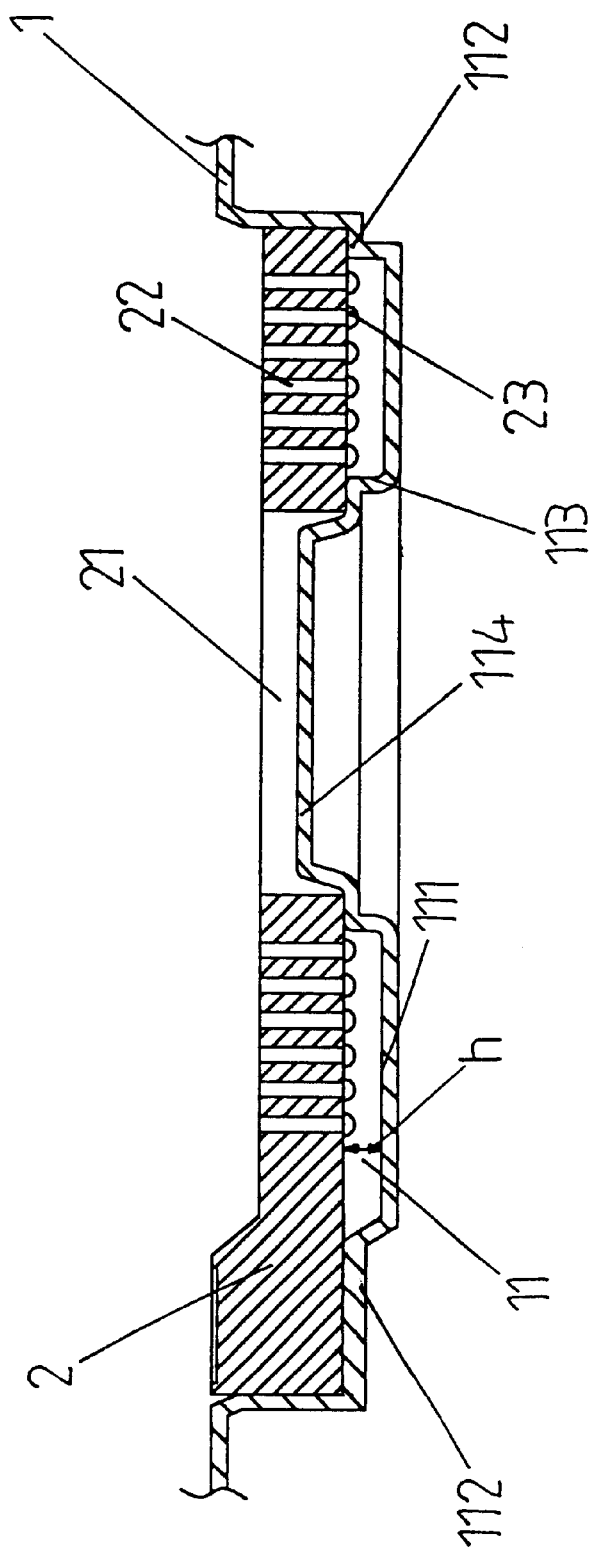
FIG. 3 is a fragmentary, sectioned side view of FIG. 2 showing the positioning of a connector in one of many receiving cavities formed on the packaging strip.

Please refer to FIG. 3. The connector 2 is positioned in the receiving cavity 11 with the central square opening 21 engaged with the locating means 114 and an area of the connector 2 adjacent to an outer periphery of the opening 21 rested on the shoulder portion of the land portion 113. Meanwhile, outer peripheral edges of the connector 2 are rested on the ribs 112 provided in the receiving cavity 11, so that most part of the connector 2 is substantially suspended in the receiving cavity 11. That is, there is a distance h (as indicated by the arrows) existing between the contacts 23 provided at the bottom surface of the connector 2 and the bottom 111 of the receiving cavity 11, preventing the contacts 23 from colliding with the bottom 111 when the packaging strip 1 is wound into a roll and therefore protecting the connectors 2 packaged in the packaging strip 1 against high damage rate. The locating means 114 projected from the top of the land portion 113 engages with the central square opening 21 of the connector 2 to hold the connector 2 in place and therefore prevents the connector 2 from moving out of the receiving cavity 11 when the packaging strip 1 is wound into a roll. That is, the locating means 114 is provided to set the connector 2 to a fixed position in the receiving cavity 11 and restrict the connector 2 from moving.

The packaging strip 1 of the present invention is structurally characterized in that the land portion 113 close to the central area of the receiving cavity 11 is the first place in the cavity 11 that arches when the receiving cavity 11 is subject to a pressure and becomes compressed. This is because most part of stress produced at the time the receiving cavity 11 is compressed would converge on the land portion 113 and arch the same. However, with the grooves 115 provided on the locating means 114 that enhance the overall structural strength of the land portion 113, the land portion 113 is not subject to permanent deformation and/or damage due to repeated pressure applied on it.

Figure 4:
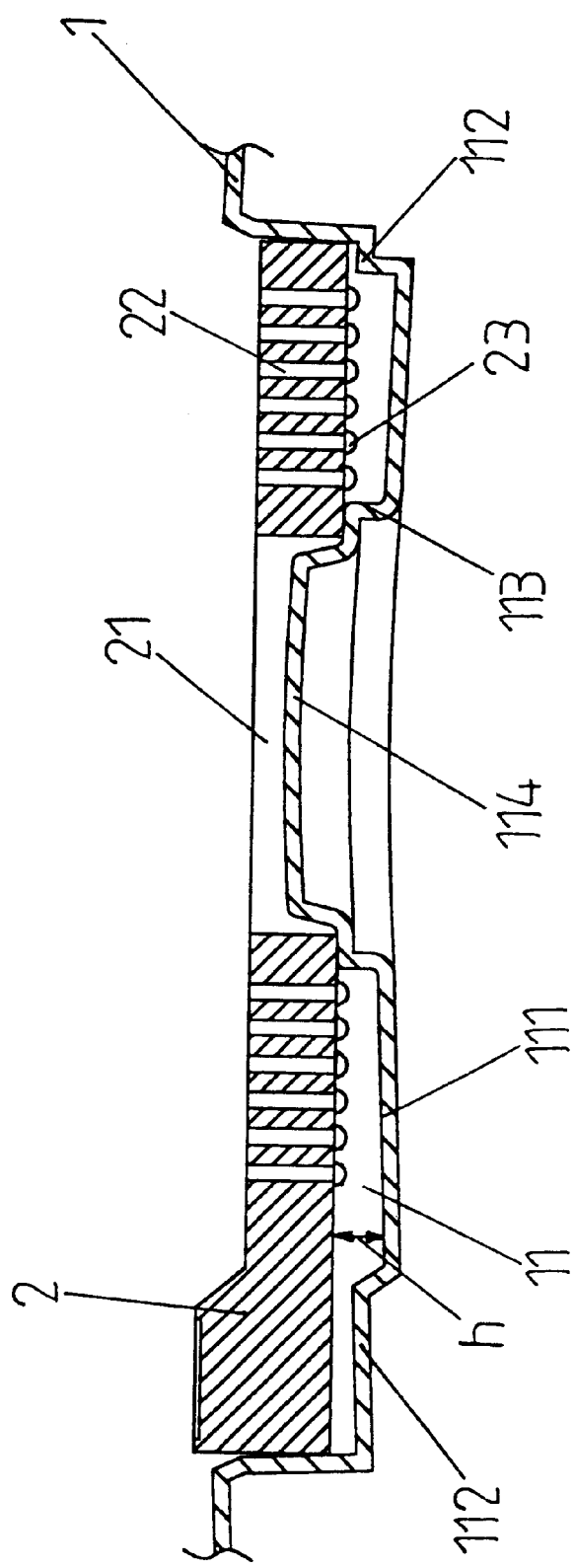
FIG. 4 is a fragmentary, sectioned side view showing the packaging strip of FIG. 3 is bent and a land portion generally centered at the receiving cavity elevates the connector positioned in the receiving cavity.

Please refer to FIG. 4. There is a tolerance of fit between the connector 2 and the receiving cavity 11. That is, the connector 2 is slightly larger than the receiving cavity 11, so that outer peripheral surfaces of the connector 2 positioned in the receiving cavity 11 press against inner wall surfaces of the receiving cavity 11 to firmly hold the connector 2 to the receiving cavity 11 and prevent the connector 2 from falling out of the receiving cavity 11 when the packaging strip 1 is wound into a roll. Please note that the compressed receiving cavity 11 on the wound packaging strip 1 causes the land portion 113 to arch and therefore elevate the connector 2, protecting the contacts 23 at the bottom surface of the connector 2 from colliding with the bottom 111 of the receiving cavity 11. That is, the distance h is increased.

Figure 5:
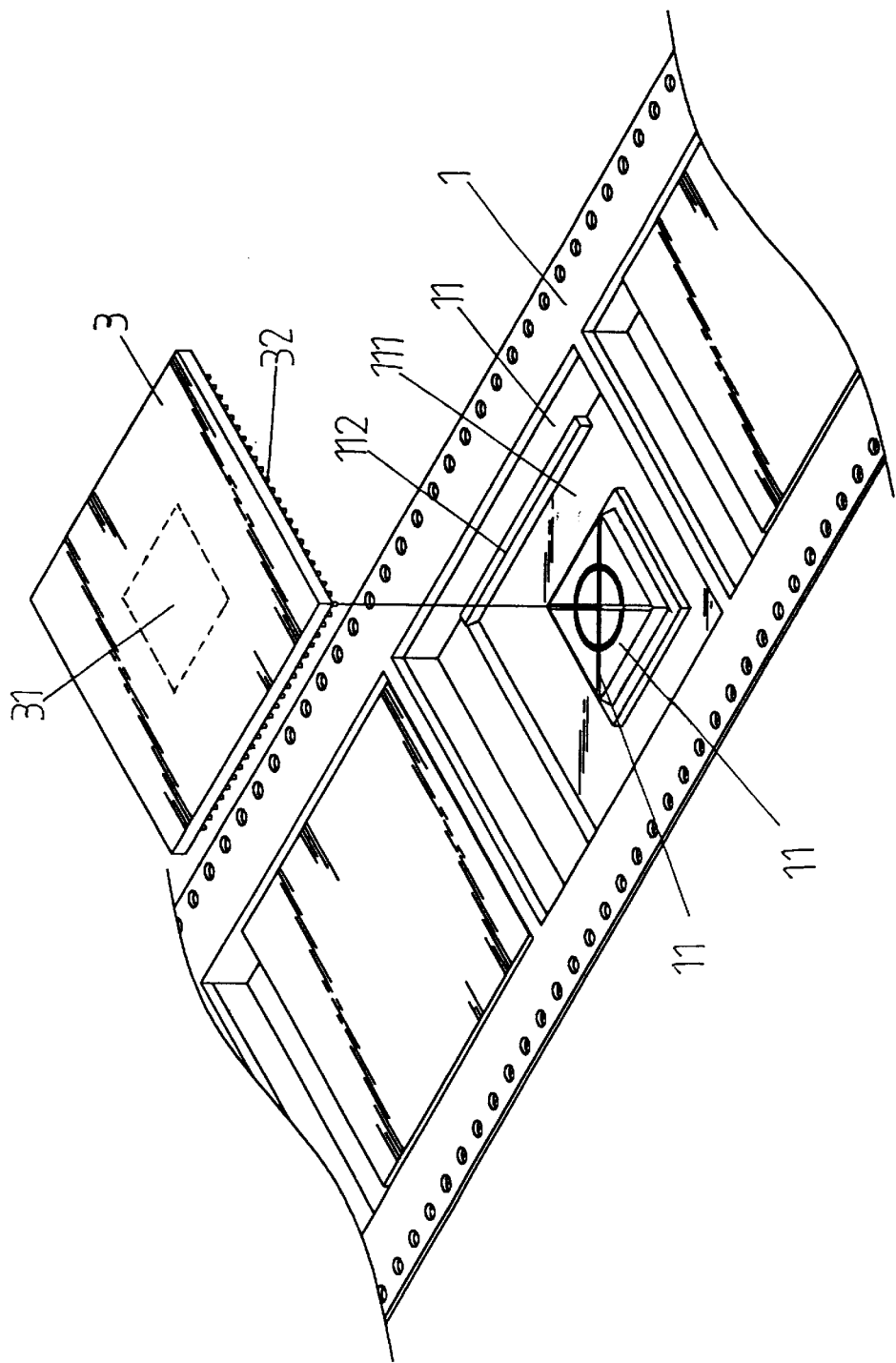
FIG. 5 is a fragmentary perspective view showing the packaging strip of the present invention is used to package chips.
Figure 6:
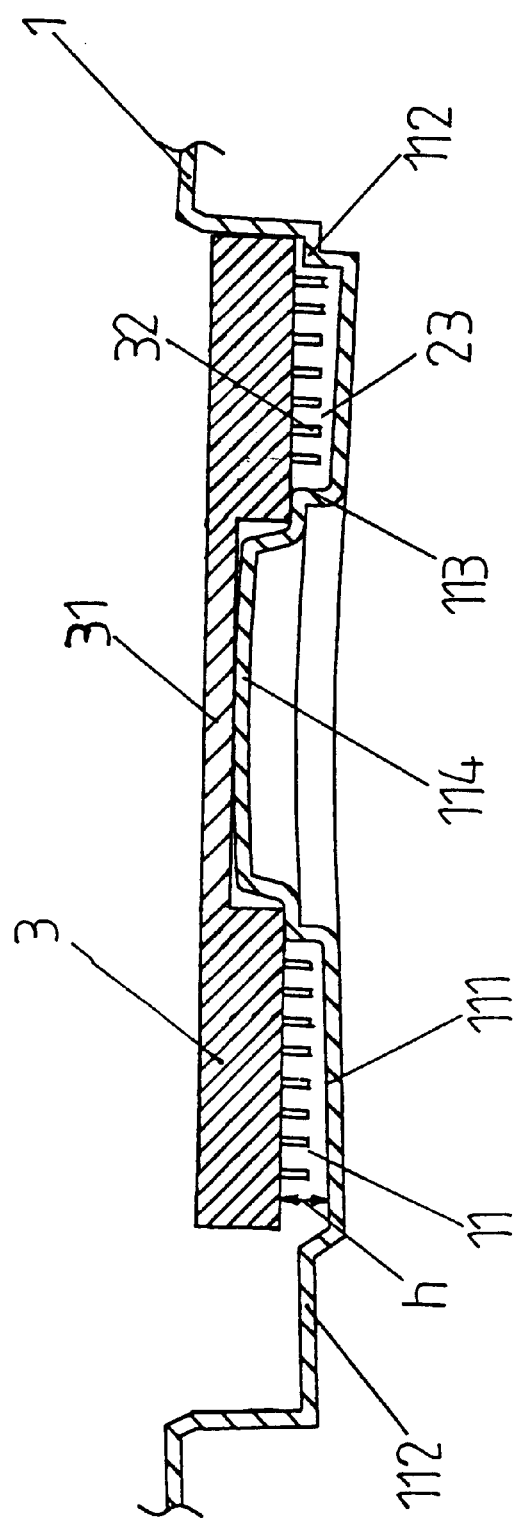
FIG. 6 is a fragmentary, sectioned side view showing the packaging strip of FIG. 5 is bent and the chip positioned in the receiving cavity is elevated by the land portion.

FIGS. 5 and 6 show that the packaging strip 1 of the present invention is used to package chips 3. It is noted that each of the chips 3 is provided at a bottom surface, except a central area 31 thereof, with a plurality of contact 32. As in the embodiment shown in FIGS. 2, 3, and 4, the chip 3 is positioned in the receiving cavity 11 with its outer peripheral edges rested on the ribs 112 and the bottom central area rested on the land portion 113 and engaged with the locating means 114, so that a distance h exists between lower ends of the contacts 32 and the bottom 111 of the receiving cavity 11. When the packaging strip 1 is wound into a roll, the receiving cavity 11 is compressed and the land portion 113 arches to elevate the chip 3 rested thereon, preventing the contacts 32 from colliding with the bottom 111 of the receiving cavity 11.

What is to be noted is the land portions 113 on the packaging strip 1 are not limited to any specific shape and number. Any type and number of land portions 113 should be included in the scope of the present invention so long as the land portions 113 in a compressed state could elevate the electronic components positioned in the receiving cavities 11.

Figure 7:
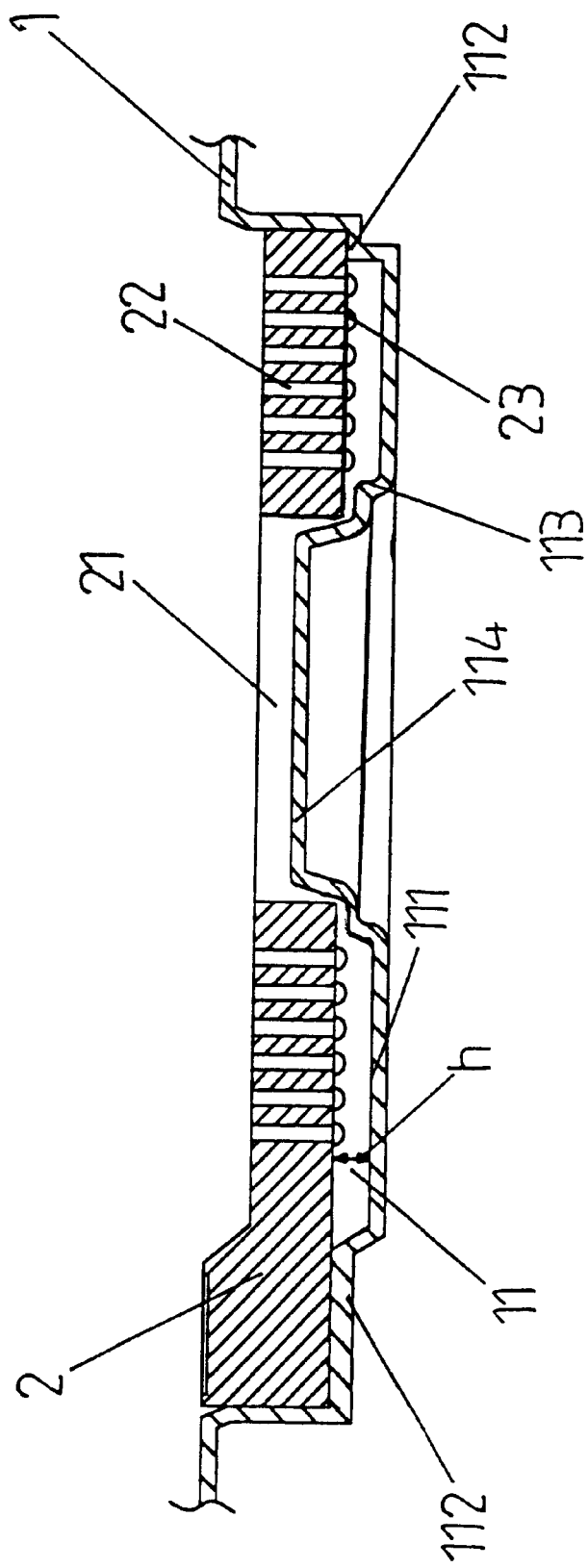
FIG. 7 shows a condition in which the connector positioned in the receiving cavity of the packaging strip of the present invention is not completely seated on the land portion.

As mentioned above, the connector 2 is positioned in the receiving cavity 11 with its outer peripheral edges rested on the ribs 112 and its central square opening 21 engaged with the projected locating means 114, so that most part of the connector 2 is substantially suspended in the receiving cavity 11. In the event there are manufacturing errors in forming the land portions 113 on the packaging strip 1, it is possible the outer peripheries of the openings 21 fail to fully rest on the shoulder portions of the land portions 113 and leave a small distance between them, as shown in FIG. 7. Nevertheless, the land portions 113 would still arch to elevate the connectors 2 when the receiving cavities 11 are compressed, and therefore protect the contacts 23 from contacting with the bottoms 111 of the receiving cavities 11. This condition also applies to the chips 3 positioned in the receiving cavities 11 to protect the contacts 32 against damage.

The present invention has been described with a preferred embodiment thereof and it is understood that many changes and modifications in the described embodiment can be carried out without departing from the scope and the spirit of the invention that is intended to be limited only by the appended claims.

What is claimed is:
1. An electronic component packaging strip, comprising a long strip that could be wound into a roll and has a row of serially and continuously arranged receiving cavities formed thereon for each receiving an electronic component therein, each of said receiving cavities being internally provided along every peripheral edge with a rib and near a central area with at least one square land portion raised from a bottom of said receiving cavity; such that said electronic component is positioned in said receiving cavity with peripheral edges of said electronic component rested on said ribs and most other part of said electronic component suspended in said receiving cavity; and said at least one land portion being adapted to arch and thereby elevate said electronic component positioned in said receiving cavity when said packaging strip is bent while being wound into a roll, protecting contacts provided at a bottom surface of said electronic component from damage due to any collision with a bottom of said receiving cavity.

2. The electronic component packaging strip as claimed in claim 1, wherein each of said land portions has a stepped top to provide an upward projected central area that serves as a locating means, and said locating means being engaged with an area on said electronic component that do not have any contact provided thereat, so as to hold said electronic component in place and restrict said electronic component from moving in said receiving cavity.

3. The electronic component packaging strip as claimed in claim 1, wherein said ribs are provided along peripheral edges of each said receiving cavity in a plurality of pairs of opposite ribs.

4. The electronic component packaging strip as claimed in claim 2, wherein said locating means are formed at their respective tops with grooves arranged in a predetermined manner to enhance a structural strength of said land portions.

* * * * *